(12) United States Patent
Goto

(10) Patent No.: US 8,174,049 B2
(45) Date of Patent: May 8, 2012

(54) SEMICONDUCTOR DEVICE AND METHOD OF FABRICATING THE SAME

(75) Inventor: Masakazu Goto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 12/628,283

(22) Filed: Dec. 1, 2009

(65) Prior Publication Data

US 2010/0176460 A1  Jul. 15, 2010

(30) Foreign Application Priority Data

Jan. 9, 2009 (JP) ................................. 2009-3560

(51) Int. Cl.
*H01L 29/66* (2006.01)

(52) U.S. Cl. ............ 257/192; 257/27; 257/69; 257/368; 257/410; 257/371; 257/392; 438/216; 438/261; 438/287; 438/769; 438/410

(58) Field of Classification Search .................. 257/192, 257/27, 69, 368, 410, 371, 392; 438/287, 438/216, 261, 769, 410
See application file for complete search history.

(56) References Cited

U.S. PATENT DOCUMENTS

| 7,521,325 | B2 * | 4/2009 | Sakoda et al. ................ 438/287 |
| 2002/0163011 | A1 * | 11/2002 | Lee ................ 257/192 |
| 2006/0214243 | A1 | 9/2006 | Sakoda et al. |
| 2009/0224329 | A1 | 9/2009 | Goto |

FOREIGN PATENT DOCUMENTS

JP  2006-278488  10/2006

OTHER PUBLICATIONS

K Shiraishi, et al. Physics in Fermi Level Pinning at the PolySi/Hf-based High-k Oxide Interface. 2004 Symposium on VLSI Technology Digest of Technical Papers, pp. 108-109.

* cited by examiner

*Primary Examiner* — Steven Loke
*Assistant Examiner* — Cuong Nguyen
(74) *Attorney, Agent, or Firm* — Turocy & Watson, LLP

(57) ABSTRACT

A semiconductor device according to one embodiment includes: a semiconductor substrate having first and second regions; a first transistor comprising a first gate insulating film and a first gate electrode thereon in the first region on the semiconductor substrate, the first gate insulating film comprising a first interface layer containing nitrogen atoms and a first high dielectric constant layer thereon; a second transistor comprising a second gate insulating film and a second gate electrode thereon in the second region on the semiconductor substrate, the second gate insulating film comprising a second interface layer and a second high dielectric constant layer thereon, the second interface layer containing nitrogen atoms at an average concentration lower than that of the first interface layer or not containing nitrogen atoms, and the second transistor having a threshold voltage different from that of the first transistor; and an element isolation region on the semiconductor substrate, the element isolation region containing oxygen atoms and isolating the first transistor from the second transistor.

19 Claims, 8 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2009-003560, filed on Jan. 9, 2009, the entire contents of which are incorporated herein by reference.

BACKGROUND

In a conventional LSI in which MISFET (Metal Insulator Semiconductor Field Effect Transistor) elements are integrated, a SRAM is broadly used as a memory combined with a Logic circuit. In recent years, miniaturization of a LSI has proceeded in order to improve processing speed thereof or to realize an increase of memory capacity. However, as a result, there is a problem of dispersion in threshold voltage caused by fluctuation of an impurity which is introduced into a semiconductor substrate.

On the other hand, a technique is known in which a tunnel leak phenomenon is suppressed by using a high dielectric constant material as a material of a gate insulating film which is thinned in accordance with miniaturization of elements. However, in general, bond between oxygen and other elements is weak in a high dielectric constant material formed by ionic bond as compared to a material formed by covalent bonding such as $SiO_2$ the bond is broken during the semiconductor fabrication process, and thus, oxygen defect is likely to occur in a gate insulating film. This technique, for example, is disclosed in a non-patent literary document of K. Shiraishi et al., Symp. of VLSI Tech., 2004, p. 108.

SUMMARY

A semiconductor device according to one embodiment includes: a semiconductor substrate having first and second regions; a first transistor comprising a first gate insulating film and a first gate electrode thereon in the first region on the semiconductor substrate, the first gate insulating film comprising a first interface layer containing nitrogen atoms and a first high dielectric constant layer thereon; a second transistor comprising a second gate insulating film and a second gate electrode thereon in the second region on the semiconductor substrate, the second gate insulating film comprising a second interface layer and a second high dielectric constant layer thereon, the second interface layer containing nitrogen atoms at an average concentration lower than that of the first interface layer or not containing nitrogen atoms, and the second transistor having a threshold voltage different from that of the first transistor; and an element isolation region on the semiconductor substrate, the element isolation region containing oxygen atoms and isolating the first transistor from the second transistor.

A semiconductor device according to another embodiment includes: a semiconductor substrate having first and second regions; a first transistor comprising a first gate insulating film and a first gate electrode thereon in the first region on the semiconductor substrate, the first gate insulating film comprising a first high dielectric constant layer; a second transistor comprising a second gate insulating film and a second gate electrode thereon in the second region on the semiconductor substrate, the second gate insulating film comprising a second high dielectric constant layer having an average value of concentration of oxygen defect higher than that of the first high dielectric constant layer, and the second transistor having a threshold voltage different from that of the first transistor; and an element isolation region on the semiconductor substrate, the element isolation region containing oxygen atoms and isolating the first transistor from the second transistor.

A method of fabricating a semiconductor device according to another embodiment includes: forming an element isolation region containing oxygen atoms on a semiconductor substrate for isolating a first region from a second region; forming a first gate insulating film, a first gate electrode on the first gate insulating film, a second gate insulating film and a second gate electrode on the second gate insulating film, the first gate insulating film and the first gate electrode being in the first region on the semiconductor substrate, the second gate insulating film and the second gate electrode being in the second region on the semiconductor substrate, the first gate insulating film comprising a first interface layer and a first high dielectric constant layer thereon, the second gate insulating film comprising a second interface layer and a second high dielectric constant layer thereon comprising the same material as the first high dielectric constant layer, the second interface layer containing nitrogen atoms at an average concentration lower than that of the first interface layer or not containing nitrogen atoms; and diffusing oxygen atoms contained in the element isolation region into the first and second high dielectric constant layers by heat treatment, thereby making an average value of concentration of oxygen defect in the first high dielectric constant layer lower than that in the second high dielectric constant layer.

DETAILED DESCRIPTION

First Embodiment

Figure 1:
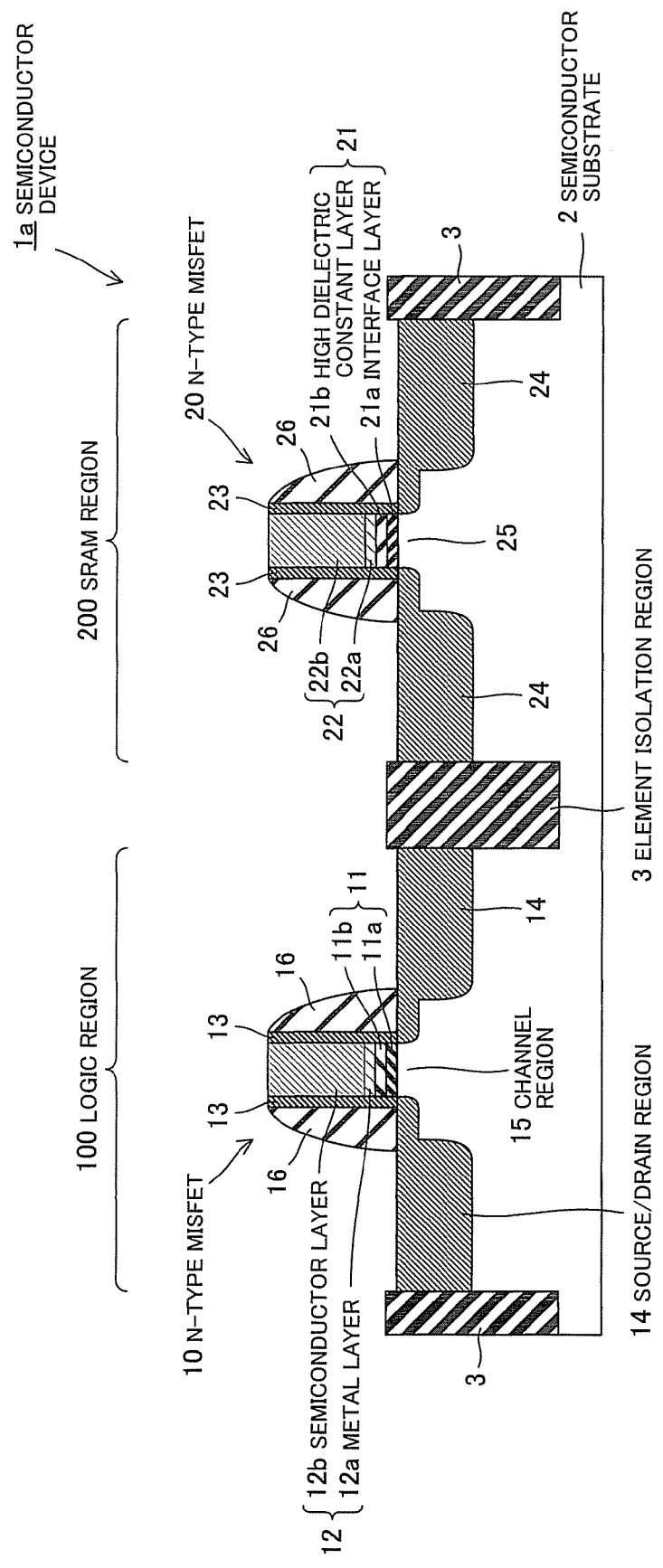
FIG. 1 is a cross sectional view of a semiconductor device according to a first embodiment.

FIG. 1 is across sectional view of a semiconductor device 1a according to a first embodiment. The semiconductor device 1a has a Logic region 100 and a SRAM region 200 on a semiconductor substrate 2. The Logic region 100 and the SRAM region 200 are electrically isolated by an element isolation region 3. In addition, n-type MISFETs 10 and 20 are respectively formed in the Logic region 100 and the SRAM region 200. Here, the n-type MISFET 20 has a threshold voltage higher than that of the n-type MISFET 10.

The semiconductor substrate 2 is made of Si-based crystal such as Si crystal.

The element isolation region 3 is made of, e.g., insulating material containing oxygen atoms such as $SiO_2$ and has a STI (Shallow Trench Isolation) structure.

The n-type MISFET 10 has a gate electrode 12 formed on the semiconductor substrate 2 via a gate insulating film 11, offset spacers 13 formed on side faces of the gate electrode 12, gate sidewalls 16 formed on side faces of the offset spacers 13, a channel region 15 formed in the semiconductor substrate 2 under the gate insulating film 11, and source/drain regions 14 formed in the semiconductor substrate 2 on both sides of the channel region 15. Note that, although it is not shown in the figures, a p-type well may be formed in a region in the semiconductor substrate 2 under the n-type MISFET 10.

The n-type MISFET 20 has a gate electrode 22 formed on the semiconductor substrate 2 via a gate insulating film 21, offset spacers 23 formed on side faces of the gate electrode 22, gate sidewalls 26 formed on side faces of the offset spacers 23, a channel region 25 formed in the semiconductor substrate 2 under the gate insulating film 21, and source/drain regions 24 formed in the semiconductor substrate 2 on both sides of the channel region 25. Note that, although it is not shown in the figures, a p-type well may be formed in a region in the semiconductor substrate 2 under the n-type MISFET 20.

In the present embodiment, a gate width Wg and a gate length Lg of the n-type MISFET 10 are substantially same as those of the n-type MISFET 20.

The gate insulating film 11 is composed of an interface layer 11a and a high dielectric constant layer 11b thereon. Meanwhile, the gate insulating film 21 is composed of an interface layer 21a and a high dielectric constant layer 21b thereon.

The interface layers 11a and 21a are made of, e.g., $SiO_2$ or insulating material consisting mainly of $SiO_2$. In addition, the interface layer 11a contains nitrogen atoms. The interface layer 21a contains nitrogen atoms at an average concentration lower than that of the interface layer 11a, or does not contain nitrogen atoms. In other words, an average value of nitrogen concentration in the interface layer 11a is larger than that in the interface layer 21a. The nitrogen atom contained in the interface layers 11a and 21a has a function to suppress diffusion of oxygen atoms by densifying bonds in the interface layers 11a and 21a, thus, the diffusion of oxygen atoms can be more strongly suppressed as the concentration of the nitrogen atom is increased. A thickness of the interface layer 11a is substantially same as that of the interface layer 21a.

Here, a difference of the average value of the nitrogen concentration between the interface layers 11a and 21a is intentionally created, which is larger than a difference unintentionally generated by manufacturing error.

The high dielectric constant layers 11b and 21b are made of insulating material containing oxygen atoms as well as having high-dielectric constant, and have a function to increase dielectric constant of the gate insulating films 11 and 12. As an insulating material having high-dielectric constant, for example, a Hf-based compound such as HfSiON, HfSiO or HfO, a Zr-based compound such as ZrSiON, ZrSiO or ZrO, and a Y-based compound such as $Y_2O_3$ are used. In addition, an concentration of oxygen defect in the high dielectric constant layer 11b is higher than that in the high dielectric constant layer 21b. A thickness of the high dielectric constant layer 11b is substantially same as that of the high dielectric constant layer 21b.

Here, a difference of the average value of the concentration of oxygen defect between the high dielectric constant layers 11b and 21b is intentionally created by differing the average value of the nitrogen concentration in the interface layer 11a from that in the interface layer 21a, which is larger than a difference unintentionally generated by manufacturing error when the average value of the nitrogen concentration in the interface layer 11a is substantially same as that of the interface layer 21a.

In general, in a high dielectric constant insulating material formed by ionic bond, the bond of oxygen to another element (a metal element or Si, etc.) is weaker than a material formed by covalent bonding such as $SiO_2$. Thus, the bond between the oxygen and the other element in the high dielectric constant layers 11b and 21b made of high dielectric constant insulating material is likely broken during the fabrication process of the semiconductor device 1a, and the oxygen defect is thereby likely to occur. In general, in an n-type MISFET, the lower the concentration of oxygen defect in the gate insulating film made of the high dielectric constant material, the higher the threshold voltage. In the present embodiment, the average value of the concentration of oxygen defect in the high dielectric constant layer 21b is lower than that in the high dielectric constant layer 11b, and the threshold voltage of the n-type MISFET 20 is higher than that of the n-type MISFET 10.

In the present embodiment, since the gate width Wg and the gate length Lg of the n-type MISFET 10 are substantially same as those of the n-type MISFET 20 and the thickness of the high dielectric constant layer 11b is substantially same as that of the high dielectric constant layer 21b, the average value of the oxygen defect amount of the high dielectric constant layer 21b is smaller than that of the high dielectric constant layer 11b.

The gate electrode 12 includes a metal layer 12a formed on the gate insulating film 11 and a semiconductor layer 12b formed on the metal layer 12a. Meanwhile, the gate electrode 22 includes a metal layer 22a formed on the gate insulating film 21 and a semiconductor layer 22b formed on the metal layer 22a.

The metal layers 12a and 22a have a function as a metal gate for preventing depletion of the gate electrodes 12 and 22. The metal layers 12a and 22a are made of, e.g., Ti, Ta, W, Mo or Ru, etc., nitride thereof or carbide thereof, or compound of those metals with Si (TiN, TaSiN or TaC, etc.).

The semiconductor layers 12b and 22b are made of a Si-based polycrystal such as polycrystalline Si or polycrystalline SiGe containing n-type impurity such as As or P. In addition, suicide layers may be formed in upper portions or the whole of the semiconductor layers 12b and 22b. By forming the semiconductor layers 12b and 22b in the upper portion of the gate electrodes 12 and 22, it is possible to improve consistency with a conventional polycrystalline Si gate electrode process.

Note that, in order to compensatingly adjust the threshold voltage of the n-type MISFETs 10 and 20, an impurity such as La, Mg, Al or Ge may be introduced into, any or all of, an interface between the semiconductor substrate 2 and the gate insulating films 11, 21, the gate insulating films 11 and 21, and an interface between the gate insulating films 11, 21 and the gate electrodes 12, 22. In addition, among these impurities, different impurities may be respectively introduced into the n-type MISFETs 10 and 20, alternatively, these impurities may be introduced into only either of them.

The offset spacers 13 and 23 are made of, e.g., insulating material such as $SiO_2$ or SiN. The thickness of the offset spacers 13 and 23 is a factor to determine positions of end portions of extension regions of the source/drain regions 14 and 24.

The gate sidewalls 16 and 26 may have, e.g., a single layer structure made of SiN or a structure of two layers made of, e.g., SiN and $SiO_2$, furthermore, may have a structure of three or more layers.

The source/drain regions 14 and 24 are formed by implanting an n-type impurity such as As or P into the semiconductor substrate 2. In addition, silicide layers may be formed in upper portions of the source/drain regions 14 and 24.

Figure 2A:
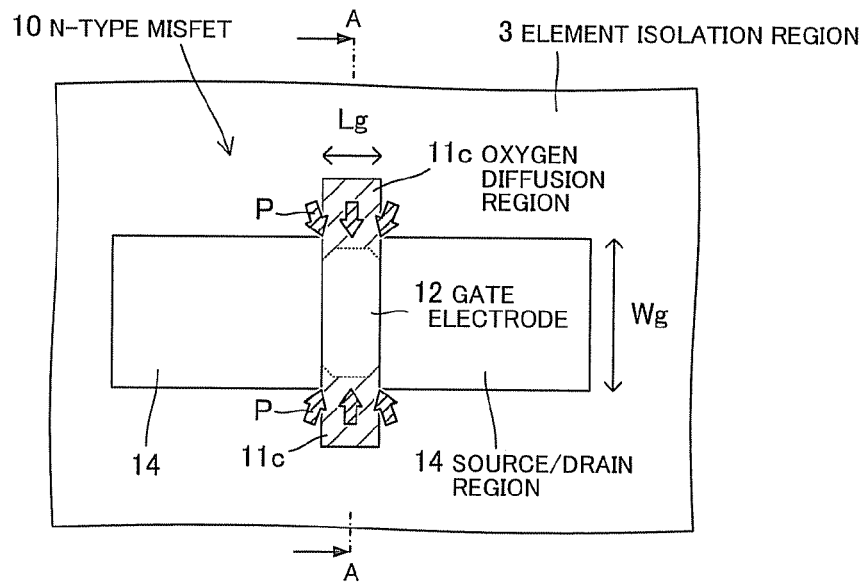
FIGS. 2A and 2B are respectively a plan view and a cross sectional view in a gate width direction of the semiconductor device according to the first embodiment.
Figure 2B:
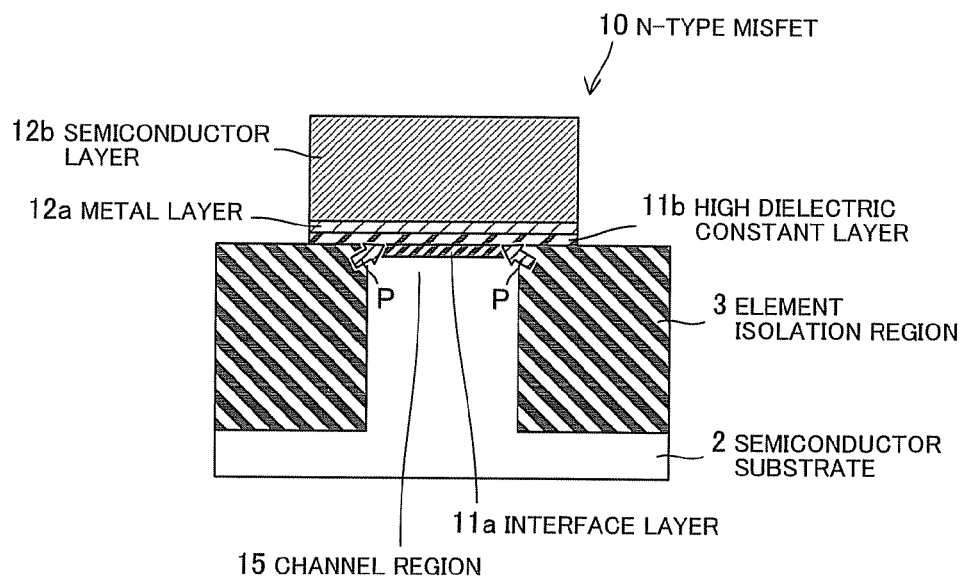

FIG. 2A is a plan view showing the vicinity of the n-type MISFET 10 of the semiconductor device 1a. FIG. 2B is a cross sectional view of the semiconductor device 1a at a cut surface A-A in FIG. 2A. As shown in FIG. 2A, a gate length of the gate electrode 12 is Lg and a gate width thereof is Wg.

Arrows P in FIGS. 2A and 2B schematically show a diffusion direction of oxygen atoms which are diffused from inside of the element isolation region 3 into the high dielectric constant layer 11b on the channel region 15. In addition, a region of the high dielectric constant layer 11b containing the oxygen atoms which are diffused from the element isolation region 3 is schematically shown as an oxygen diffusion region 11c. Since the oxygen atoms are diffused to gate length direction ends of the high dielectric constant layer 11b not only from a direction vertical to the gate length direction but also from a diagonal direction, the oxygen diffusion region 11c has a shape in which gate length direction ends thereof extend toward a center of the high dielectric constant layer 11b.

The oxygen atoms contained in the element isolation region 3 are diffused outside in a high-temperature heat treatment process such as a process of activating the impurity in the source/drain regions 14. The oxygen atoms diffused into the high dielectric constant layer 11b compensate the oxygen defect of the high dielectric constant layer 11b and decreases the concentration of oxygen defect.

On the other hand, as described above, the interface layer 11a containing nitrogen atoms has a function to suppress the diffusion of oxygen atoms. Thus, the diffusion of oxygen atoms from the element isolation region 3 into the high dielectric constant layer 11b via the interface layer 11a is suppressed, and as a result, the decrease of the concentration of oxygen defect in the high dielectric constant layer 11b is reduced.

Note that, although the n-type MISFET 10 is explained as an example in the above explanation, it is the same to the n-type MISFET 20. Since the average value of the nitrogen concentration in the interface layer 11a of the n-type MISFET 10 is larger than that in the interface layer 21a of the n-type MISFET 20, the diffusion of the oxygen atoms is more strongly suppressed. Thus, the compensated amount of the oxygen defect of the high dielectric constant layer 11b is less than that of the high dielectric constant layer 21b, and the average value of the concentration of oxygen defect in the high dielectric constant layer 11b is higher than that in the high dielectric constant layer 21b. Note that, even if the high dielectric constant layer 11b and the high dielectric constant layer 21b are made of same material, the average value of the concentration of oxygen defect in the high dielectric constant layer 11b is higher than that in the high dielectric constant layer 21b. Therefore, even if the high dielectric constant layer 11b and the high dielectric constant layer 21b are made of same material, the average value of the oxygen concentration in the high dielectric constant layer 11b is lower than that in the high dielectric constant layer 21b.

Figure 3A:
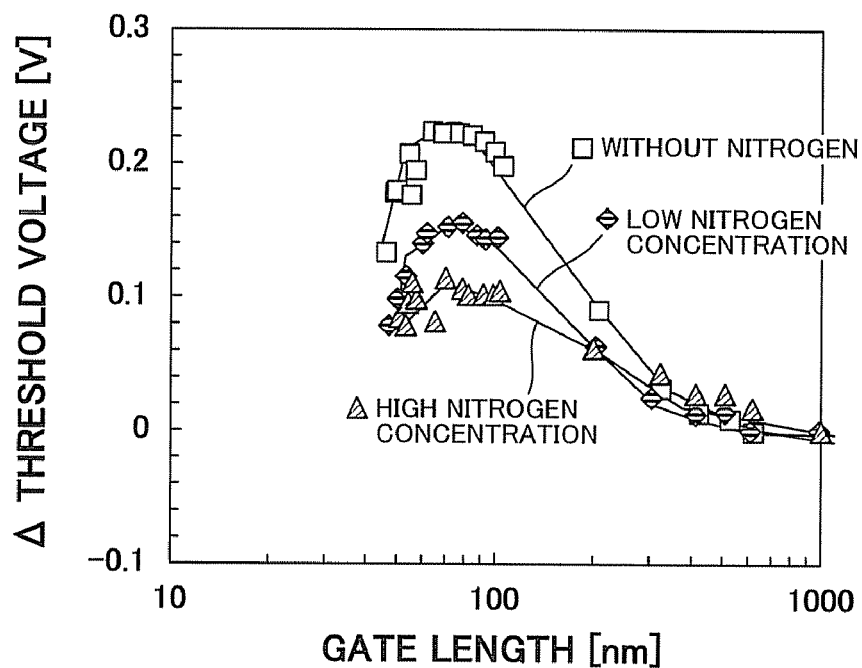
FIGS. 3A and 3B are respectively graphs showing a relation between a gate length Lg and threshold voltage of an n-type MISFET and that between a gate width Wg and threshold voltage of the n-type MISFET.

FIG. 3A is a graph showing a relation between a gate length Lg and threshold voltage of an n-type MISFET having the same configuration as the present embodiment under respective conditions of an interface layer which are the cases that the nitrogen atom is not contained, is contained at low concentration, and is contained at high concentration. Note that, a vertical axis in the figure represents a difference from the reference value when the threshold voltage at the gate length of 1000 nm is defined as a reference value (OV). In addition, HfSiON is used as a high dielectric constant layer of a gate insulating film.

As shown in FIG. 3A, the threshold voltage tends to decrease as the nitrogen concentration is high, in particular, this tendency is remarkable when the gate length is about 100 nm or less. The reason for this is considered that, in the oxygen diffusion region (which corresponds to the oxygen diffusion region 11c of the high dielectric constant layer 21b), a percentage of a region, in which the oxygen atoms are more diffused, at the gate length direction ends becomes larger as the gate length becomes smaller, and thus the concentration of oxygen defect in the high dielectric constant layer is more decreased.

Figure 3B:
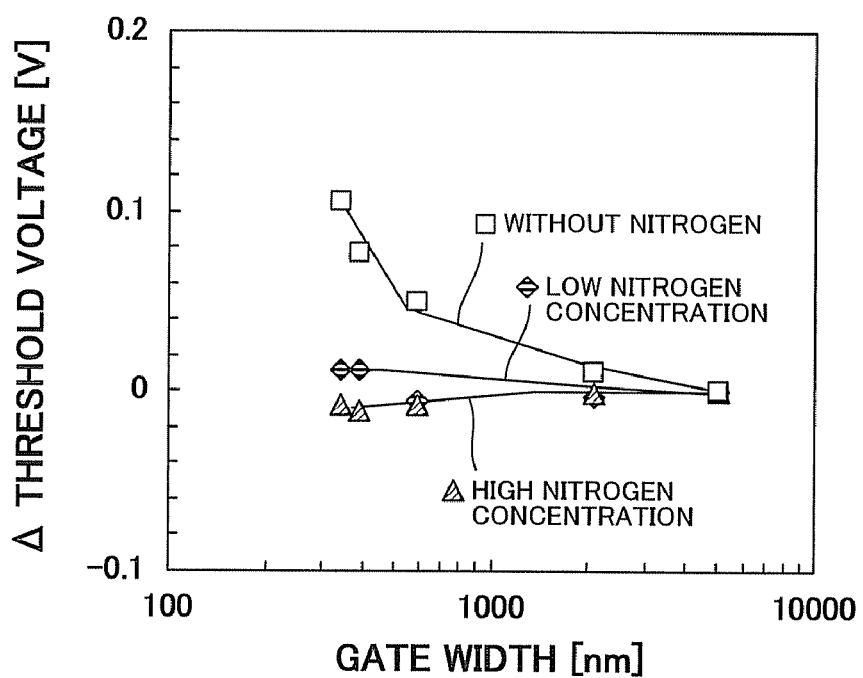

FIG. 3B is a graph showing a relation between a gate width Wg and threshold voltage of an n-type MISFET under respective conditions of an interface layer which are the cases that the nitrogen atom is not contained, is contained at low concentration, and is contained at high concentration. Note that, a vertical axis in the figure represents a difference from the reference value when the threshold voltage at the gate width of 5000 nm is defined as a reference value (OV). In addition, HfSiON is used as a high dielectric constant layer of a gate insulating film.

As shown in FIG. 3B, the threshold voltage tends to decrease as the nitrogen concentration is high, in particular, this tendency is remarkable when the gate width is about 600 nm or less. The reason for this is considered that the distance from the high dielectric constant layer to the element isolation region becomes smaller as the gate width becomes smaller, the amount of the oxygen atoms diffused from the element isolation region into the high dielectric constant layer increases, and thus the concentration of oxygen defect in the high dielectric constant layer is more decreased.

The results shown in FIGS. 3A and 3B support that the diffusion of the oxygen atoms from inside of the element isolation region 3 into the high dielectric constant layers 11b and 21b on the channel regions 15 and 25 affects the threshold voltages of the n-type MISFETs 10 and 20 and, furthermore, the threshold voltage can be controlled by adjusting the nitrogen concentration in the interface layers 11a and 21a.

An example of a method of fabricating a semiconductor device 1a according to the present embodiment will be described hereinafter.

FIGS. 4A to 4G are cross sectional views showing processes for fabricating the semiconductor device 1a according to the first embodiment.

Figure 4A:
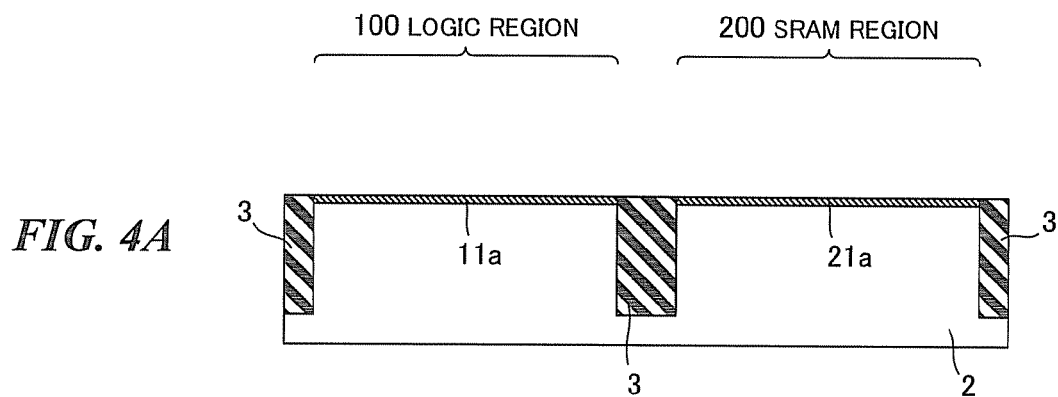
FIGS. 4A to 4G are cross sectional views showing processes for fabricating the semiconductor device according to the first embodiment.

Firstly, as shown in FIG. 4A, after isolating the Logic region 100 for forming the n-type MISFET 10 from the SRAM region 200 for forming the n-type MISFET 20 by forming the element isolation region 3 on the semiconductor substrate 2, the interface layers 11a and 21a are respectively formed on the Logic region 100 and the SRAM region 200 on the semiconductor substrate 2 by thermal oxidation method, etc.

Here, the element isolation region 3 is formed by, e.g., following process. Firstly, a trench is formed on the semiconductor substrate 2 by photolithography method and RIE (Reactive Ion Etching) method. Next, a $SiO_2$ film is deposited in the trench by CVD (Chemical Vapor Deposition) method, and is substantially planarized by CMP (Chemical Mechanical Polishing) method for shaping into the element isolation region 3.

In addition, although it is not shown in the figures, after forming the element isolation region 3, a p-type impurity is implanted into the semiconductor substrate 2 by an ion implantation procedure for each forming a channel region and a well in the Logic region 100 and the SRAM region 200. The conductivity type impurity in the channel region and the well is activated by heat treatment such as RTA (Rapid Thermal Annealing) method.

Note that, in the present embodiment, since the adjustment of the threshold voltage is performed by adjusting the concentration of oxygen defect in the high dielectric constant layers 11b and 21b, an impurity at a concentration higher than that introduced into the Logic region 100 does not need to be introduced into the channel region of the SRAM region 200 at this stage.

Figure 4B:
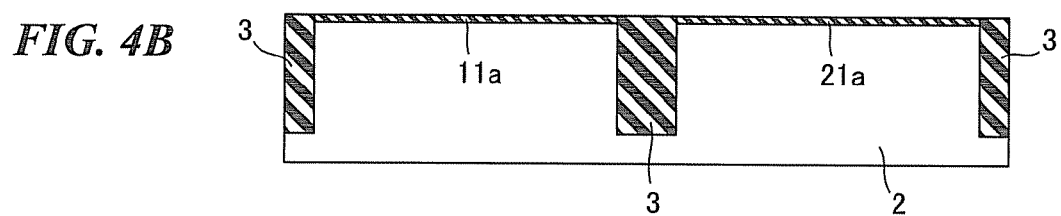

Next, as shown in FIG. 4B, the nitrogen atoms are introduced into the interface layers 11a and 21a by plasma nitriding method, etc. The nitrogen concentration in the interface layer 21a of the SRAM region 200 is nearly determined at this stage. Depending on circumstances, the nitrogen concentration in the interface layer 21a may be set to 0 by omitting this process.

Figure 4C:
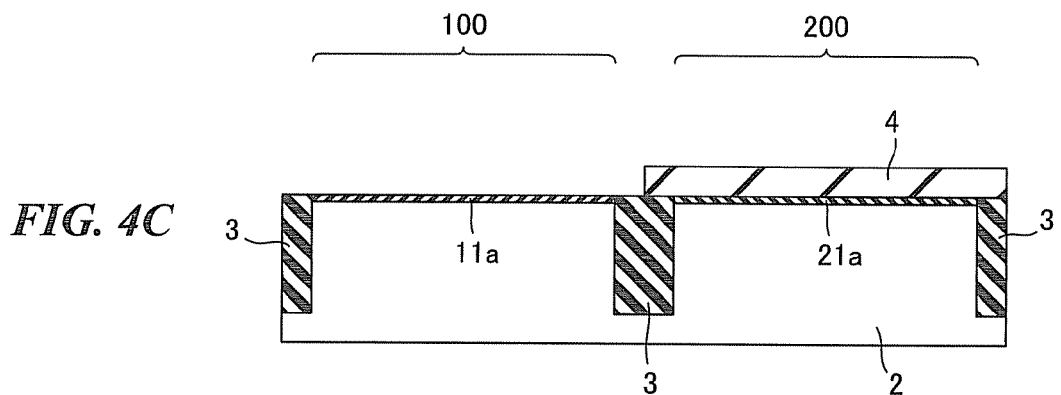

Next, as shown in FIG. 4C, after forming a mask material 4 in the SRAM region 200, nitrogen is selectively introduced into the interface layer 11a by plasma nitriding method, etc. As a result, the average value of the nitrogen concentration in the interface layer 11a becomes higher than that in the interface layer 21a. The nitrogen concentration in the interface layer 11a of the Logic region 100 is nearly determined at this stage.

Here, the mask material 4 is made of, e.g., SiN, etc., is formed on the entire surface of the semiconductor substrate 2 and is subsequently patterned by photolithography method and RIE method so as to remain in the SRAM region 200.

Figure 4D:
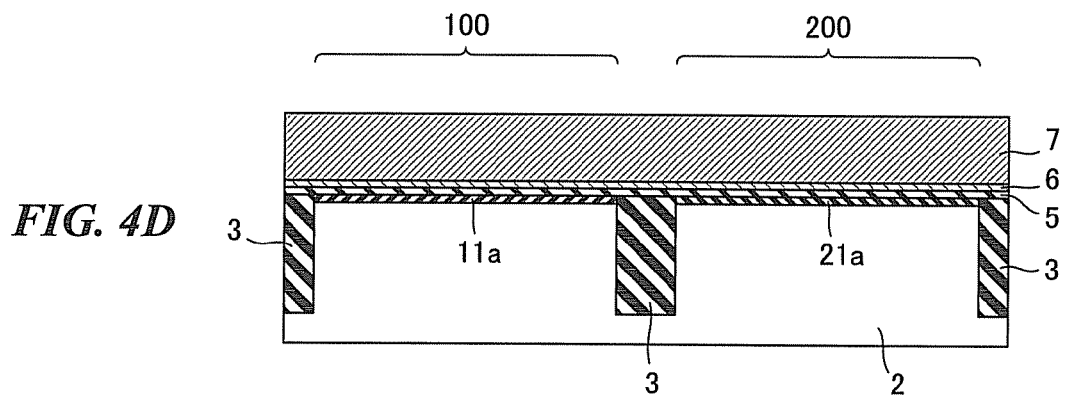

Next, as shown in FIG. 4D, after removing the mask material 4, a high dielectric constant insulating film 5, a metal film 6 and a semiconductor film 7 are laminated on the interface layers 11a and 21a.

Here, the mask material 4 is removed by wet etching method using phosphoric acid, etc. In addition, the high dielectric constant insulating film 5 is formed by, e.g., CVD (Chemical Vapor Deposition) method and plasma nitriding method. Meanwhile, the metal film 6 is formed by PVD (Physical Vapor Deposition) method, etc. In addition, the semiconductor film 7 is formed by CVD method, etc.

Figure 4E:
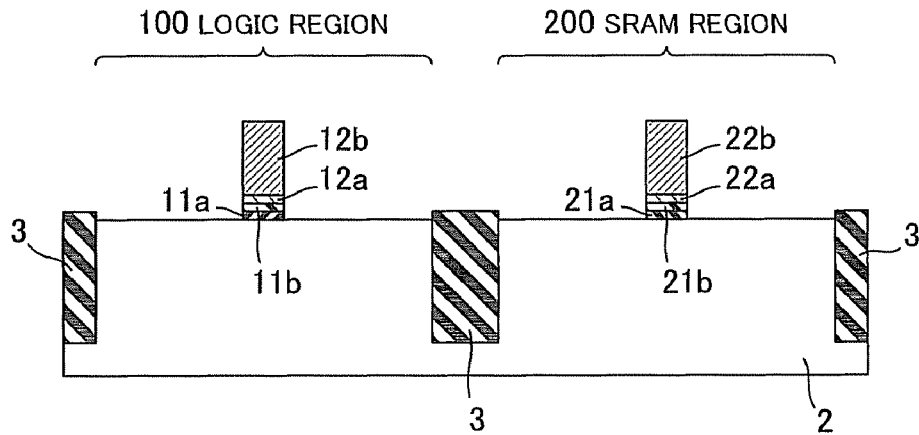

Next, as shown in FIG. 4E, the semiconductor film 7, the metal film 6 and the high dielectric constant insulating film 5 are patterned by, e.g., photolithography method and RIE method. As a result, the semiconductor film 7 is shaped into the semiconductor layers 12b and 22b. In addition, the metal film 6 is shaped into the metal layers 12a and 22a. Also, the high dielectric constant insulating film 5 is shaped into the high dielectric constant layers 11b and 21b.

Figure 4F:
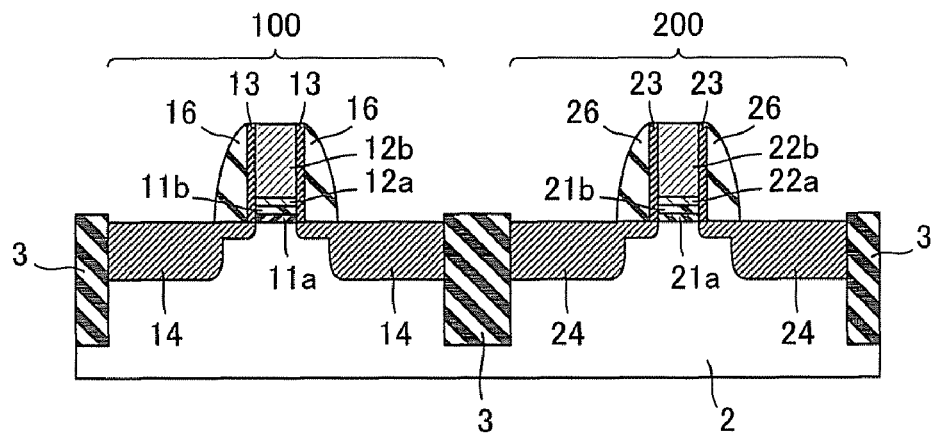

Next, as shown in FIG. 4F, the offset spacers 13, 23, the gate sidewalls 16, 26 and the source/drain regions 14 and 24 are formed. A specific method of forming thereof will be described hereinafter.

Firstly, after respectively forming the offset spacers 13 and 23 on side faces of the gate insulating film 11 and the gate electrode 12 and on those of the gate insulating film 21 and the gate electrode 22, an n-type impurity is each introduced into the Logic region 100 and the SRAM region 200 by the ion implantation procedure using the gate electrodes 12, 22 and the offset spacers 13 and 23 as a mask, which results in that extension regions of the source/drain regions 14 and 24 are formed.

Next, after respectively forming the gate sidewalls 16 and 26 on side faces of the offset spacers 13 and on those of the offset spacers 23, an n-type impurity is each introduced into the Logic region 100 and the SRAM region 200 to the positions deeper than the extension regions by the ion implantation procedure using the gate electrodes 12, 22, the offset spacers 13, 23 and the gate sidewalls 16 and 26 as a mask, which results in that the source/drain regions 14 and 24 are formed.

Figure 4G:
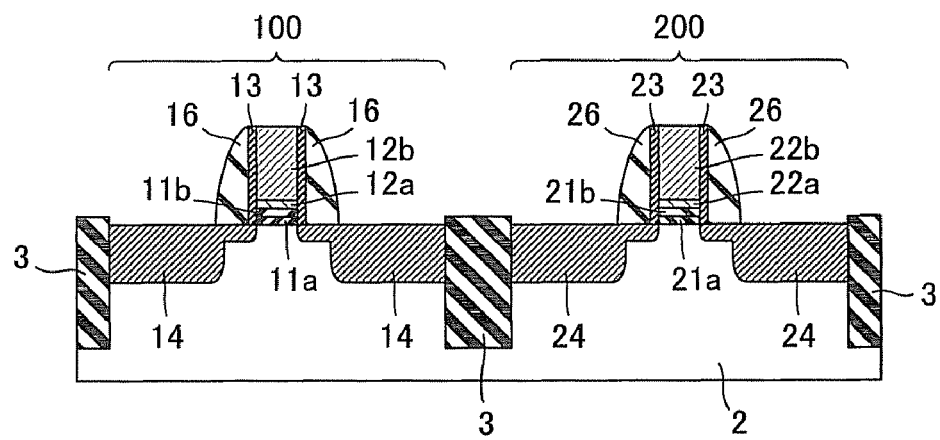

Next, as shown in FIG. 4G, the conductivity type impurity contained in the source/drain regions 14 and 24, etc., in the semiconductor substrate 2 is activated by heat treatment such as RTA method. The oxygen atoms in the element isolation region 3 are diffused into the high dielectric constant layers 11b and 21b by heat applied at this time.

At this time, since the average value of the nitrogen concentration in the interface layer 11a is higher than that in the interface layer 21a, the compensated amount of the oxygen defect of the high dielectric constant layer 11b becomes smaller than that of the high dielectric constant layer 21b, and the average value of the concentration of oxygen defect in the high dielectric constant layer 11b becomes higher than that in the high dielectric constant layer 21b. As a result, the threshold voltage of the n-type MISFET 20 in the SRAM region 200 becomes higher than that of the n-type MISFET 10 in the Logic region 100.

Note that, the diffusion of the oxygen atoms from the element isolation region 3 into the high dielectric constant layers 11b and 21b may occur during other thermal processes.

After that, suicide layers may be formed on the gate electrodes 12, 22 and the source/drain regions 14 and 24.

Effect of the First Embodiment

According to the first embodiment, by setting the average value of the nitrogen concentration in the interface layer 11a higher than that in the interface layer 21a, the average value of the concentration of oxygen defect in the high dielectric constant layer 11b can be higher than that in the high dielectric constant layer 21b, and thus the threshold voltage of the n-type MISFET 20 in the SRAM region 200 can be higher than that of the n-type MISFET 10 in the Logic region 100.

In addition, by controlling each nitrogen concentration in the interface layers 11a and 21a, it is possible to set respective appropriate threshold voltages for the n-type MISFET 10 in the Logic region 100 and the n-type MISFET 20 in the SRAM region 200.

In addition, since it is not necessary to adjust the threshold voltage depending on the concentration of the impurity introduced into the semiconductor substrate 2, it is possible to suppress the dispersion in the threshold voltage caused by fluctuation of the impurity in the semiconductor substrate 2.

Second Embodiment

The second embodiment is different from the first embodiment in that p-type MISFETs are formed in the Logic region and the SRAM region. Note that, the explanation will be omitted or simplified for the same points as the first embodiment, such as materials of each member.

Figure 5:
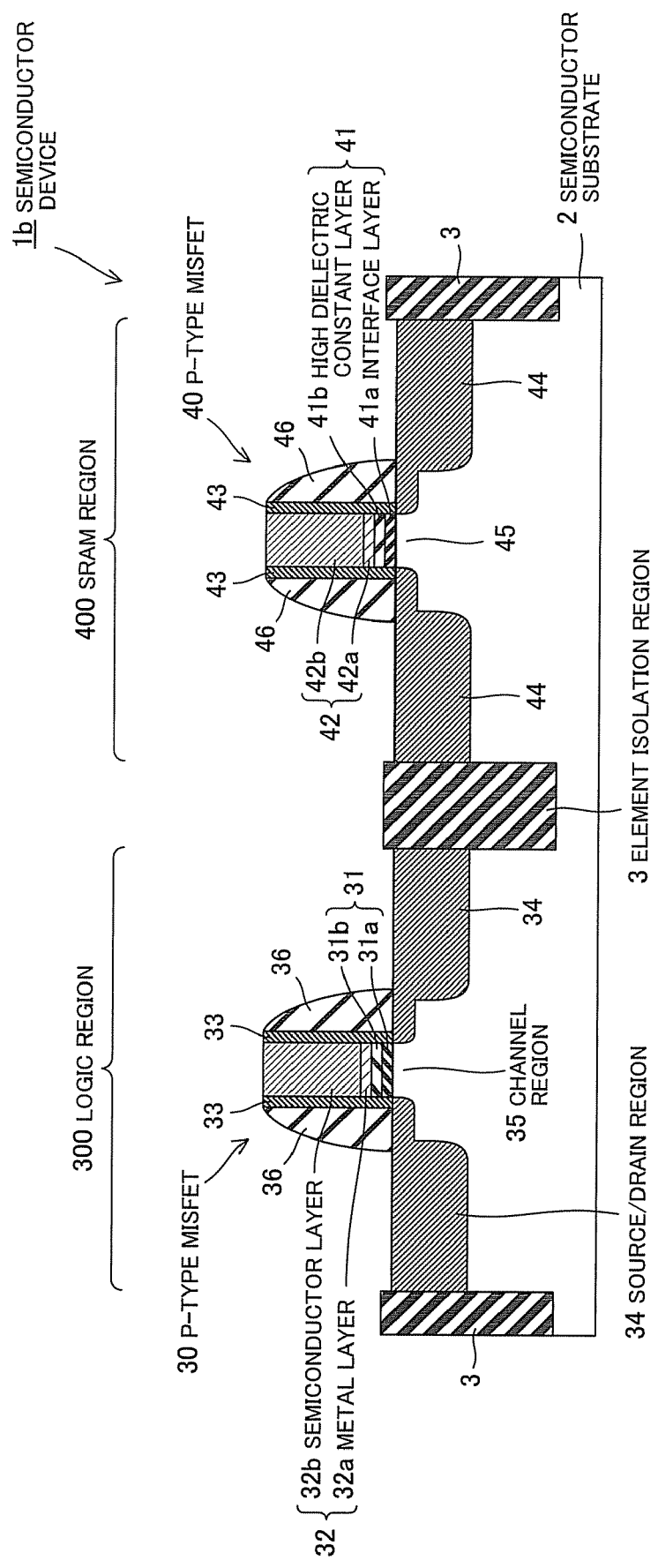
FIG. 5 is a cross sectional view of a semiconductor device according to a second embodiment.

FIG. 5 is a cross sectional view of a semiconductor device 1b according to a second embodiment. The semiconductor device 1b has a Logic region 300 and a SRAM region 400 on a semiconductor substrate 2. The Logic region 300 and the SRAM region 400 are electrically isolated by an element isolation region 3. In addition, p-type MISFETs 30 and 40 are respectively formed in the Logic region 300 and the SRAM region 400. Here, the p-type MISFET 40 has a threshold voltage higher than that of the p-type MISFET 30.

The n-type MISFET 30 has a gate electrode 32 formed on the semiconductor substrate 2 via a gate insulating film 31, offset spacers 33 formed on side faces of the gate electrode 32, gate sidewalls 36 formed on side faces of the offset spacers 33, a channel region 35 formed in the semiconductor substrate 2 under the gate insulating film 31, and source/drain regions 34 formed in the semiconductor substrate 2 on both sides of the channel region 35. Note that, although it is not shown in the figures, an n-type well may be formed in a region in the semiconductor substrate 2 under the p-type MISFET 30.

The n-type MISFET 40 has a gate electrode 42 formed on the semiconductor substrate 2 via a gate insulating film 41, offset spacers 43 formed on side faces of the gate electrode 42, gate sidewalls 46 formed on side faces of the offset spacers 43, a channel region 45 formed in the semiconductor substrate 2 under the gate insulating film 41, and source/drain regions 44 formed in the semiconductor substrate 2 on both sides of the channel region 45. Note that, although it is not shown in the figures, an n-type well may be formed in a region in the semiconductor substrate 2 under the p-type MISFET 40.

The gate insulating film 31 is composed of an interface layer 31*a* and a high dielectric constant layer 31*b* thereon. Meanwhile, the gate insulating film 41 is composed of an interface layer 41*a* and a high dielectric constant layer 41*b* thereon.

The interface layers 31*a* and 41*a* are made of, e.g., insulating material consisting mainly of $SiO_2$. In addition, an average value of nitrogen concentration in the interface layer 41*a* is larger than that in the interface layer 31*a*. The nitrogen atom contained in the interface layers 31*a* and 41*a* has a function to suppress diffusion of oxygen atoms by densifying the bonds in the interface layers 31*a* and 41*a*, thus, the diffusion of oxygen atoms can be more strongly suppressed as the concentration of the nitrogen atom is increased. Note that, the interface layer 31*a* may or may not contain the nitrogen atoms.

The high dielectric constant layers 31*b* and 41*b* are made of insulating material having high-dielectric constant, and have a function to increase dielectric constant of the gate insulating films 31 and 41. In the present embodiment, since the average value of the nitrogen concentration in interface layer 41*a* is higher than that of the interface layer 31*a*, the diffusion migration of oxygen atoms is more strongly suppressed. Thus, the compensated amount of the oxygen defect of the high dielectric constant layer 41*b* is less than that of the high dielectric constant layer 31*b*, and the average value of the concentration of oxygen defect in the high dielectric constant layer 41*b* is higher than that in the high dielectric constant layer 31*b*. Note that, even if the high dielectric constant layer 31*b* and the high dielectric constant layer 41*b* are made of same material, the average value of the concentration of oxygen defect in the high dielectric constant layer 41*b* is higher than that in the high dielectric constant layer 31*b*. Therefore, even if the high dielectric constant layer 31*b* and the high dielectric constant layer 41*b* are made of same material, the average value of the oxygen concentration in the high dielectric constant layer 41*b* is lower than that in the high dielectric constant layer 31*b*.

In general, in a p-type MISFET, the higher the concentration of oxygen defect in the gate insulating film made of the high dielectric constant material, the higher the threshold voltage. In the present embodiment, the average value of the concentration of oxygen defect in the high dielectric constant layer 41*b* is higher than that in the high dielectric constant layer 31*b*, and the threshold voltage of the p-type MISFET 40 is higher than that of the p-type MISFET 30.

The gate electrode 32 includes a metal layer 32*a* formed on the gate insulating film 31 and a semiconductor layer 32*b* formed on the metal layer 32*a*. Meanwhile, the gate electrode 42 includes a metal layer 42*a* formed on the gate insulating film 41 and a semiconductor layer 42*b* formed on the metal layer 42*a*.

The metal layers 32*a* and 42*a* have a function as a metal gate for preventing depletion of the gate electrodes 32 and 42.

The semiconductor layers 32*b* and 42*b* are made of Si-based polycrystal such as polycrystalline Si or polycrystalline SiGe, etc., containing p-type impurity such as B or $BF_2$. In addition, silicide layers may be formed in upper portions or the whole of the semiconductor layers 32*b* and 42*b*.

The source/drain regions 34 and 44 are formed by implanting a p-type impurity such as B or $BF_2$ into the semiconductor substrate 2. In addition, silicide layers may be formed in upper portions of the source/drain regions 34 and 44.

Figure 6A:
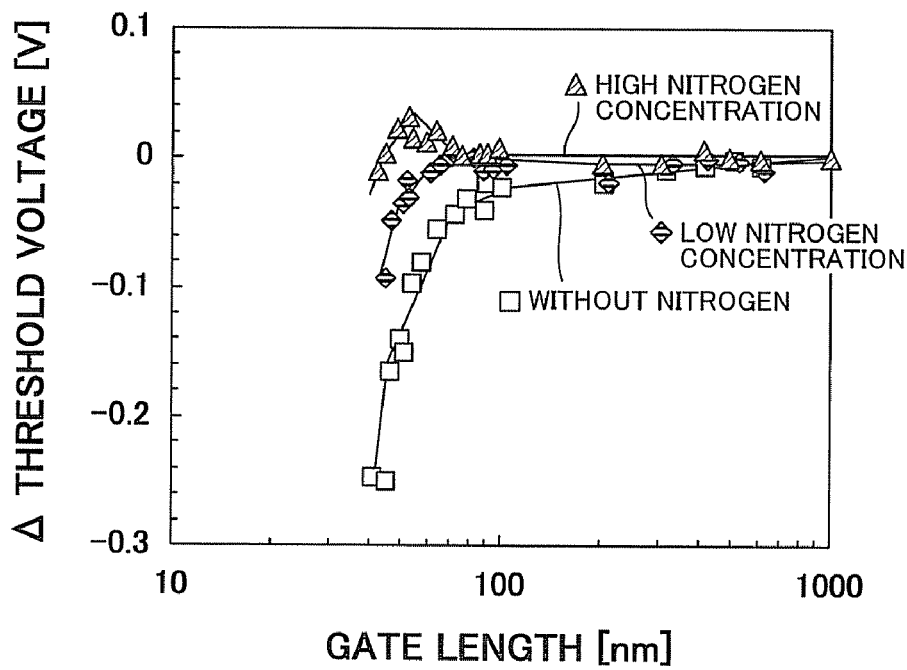
FIGS. 6A and 6B are respectively graphs showing a relation between a gate length Lg and threshold voltage a p-type MISFET and that between a gate width Wg and threshold voltage of the p-type MISFET.

FIG. 6A is a graph showing a relation between a gate length and threshold voltage of a p-type MISFET having the same configuration as the present embodiment under respective conditions of an interface layer which are the cases that the nitrogen atom is not contained, is contained at low concentration and is contained at high concentration. Note that, a vertical axis in the figure represents a difference from the reference value when the threshold voltage at the gate length of 1000 nm is defined as a reference value (OV). In addition, HfSiON is used as a high dielectric constant layer of a gate insulating film.

As shown in FIG. 6A, the threshold voltage tends to increase as the nitrogen concentration is high, in particular, this tendency is remarkable when the gate length is about 70 nm or less. The reason for this is considered that, in the oxygen diffusion region of the high dielectric constant layer, a percentage of a region, in which the oxygen atoms are more diffused, at the gate length direction ends becomes larger as the gate length becomes smaller, thus and the concentration of oxygen defect in the high dielectric constant layer is more decreased.

Figure 6B:
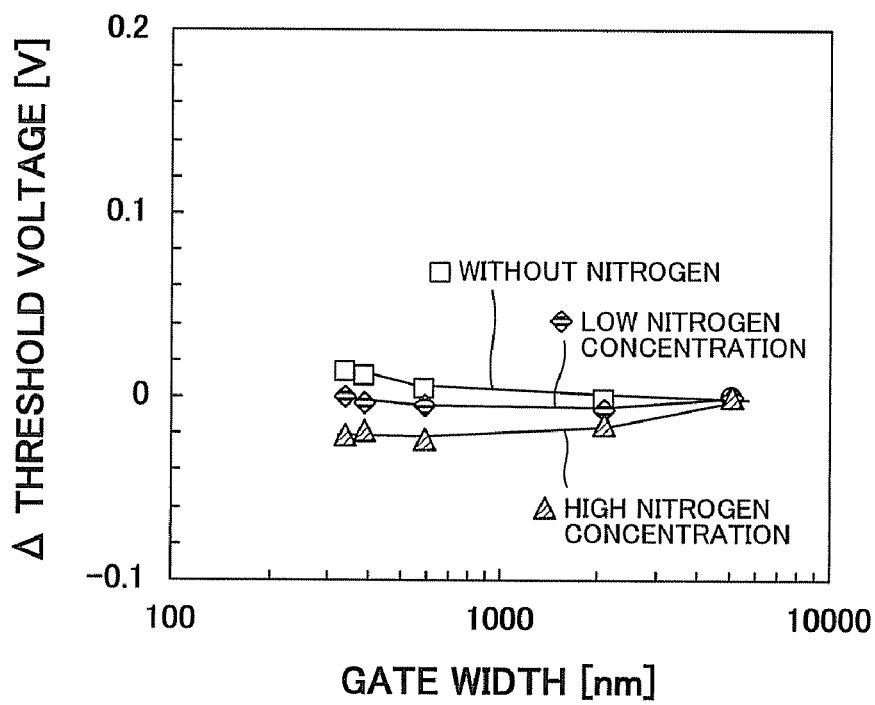

FIG. 6B is a graph showing a relation between a gate width and threshold voltage of a p-type MISFET under respective conditions of an interface layer which are the cases that the nitrogen atom is not contained, is contained at low concentration and is contained at high concentration. Note that, a vertical axis in the figure represents a difference from the reference value when the threshold voltage at the gate width of 5000 nm is defined as a reference value (OV). In addition, HfSiON is used as a high dielectric constant layer of a gate insulating film.

As shown in FIG. 6B, gate width dependence of the threshold voltage is low and nitrogen concentration dependence of the interface layer is also low.

The above results support that the diffusion of the oxygen atoms from inside of the element isolation region 3 into the high dielectric constant layers 31*b* and 41*b* on the channel regions 35 and 45 affects the threshold voltages of the p-type MISFETs 30 and 40 and, furthermore, the threshold voltage can be controlled by adjusting the nitrogen concentration in the interface layers 31*a* and 41*a*.

Effect of the Second Embodiment

According to the second embodiment, by setting the average value of the nitrogen concentration in the interface layer 41a higher than that in the interface layer 31a, the average value of the concentration of oxygen defect in the high dielectric constant layer 41b can be higher than that in the high dielectric constant layer 31b, and thus the threshold voltage of the p-type MISFET 40 in the SRAM region 400 can be higher than that of the p-type MISFET 30 in the Logic region 300.

In addition, by controlling each nitrogen concentration in the interface layers 31a and 41a, it is possible to set respective appropriate threshold voltages for the p-type MISFET 30 in the Logic region 300 and the p-type MISFET 40 in the SRAM region 400.

In addition, since it is not necessary to adjust the threshold voltage depending on the concentration of the impurity introduced into the semiconductor substrate 2, it is possible to suppress the dispersion in the threshold voltage caused by fluctuation of the impurity in the semiconductor substrate 2.

Third Embodiment

The third embodiment is different from the first embodiment in that n-type and p-type MISFETs are each formed in the Logic region and the SRAM region. Note that, the explanation will be omitted or simplified for the same points as the first embodiment, such as materials of each member.

Figure 7:
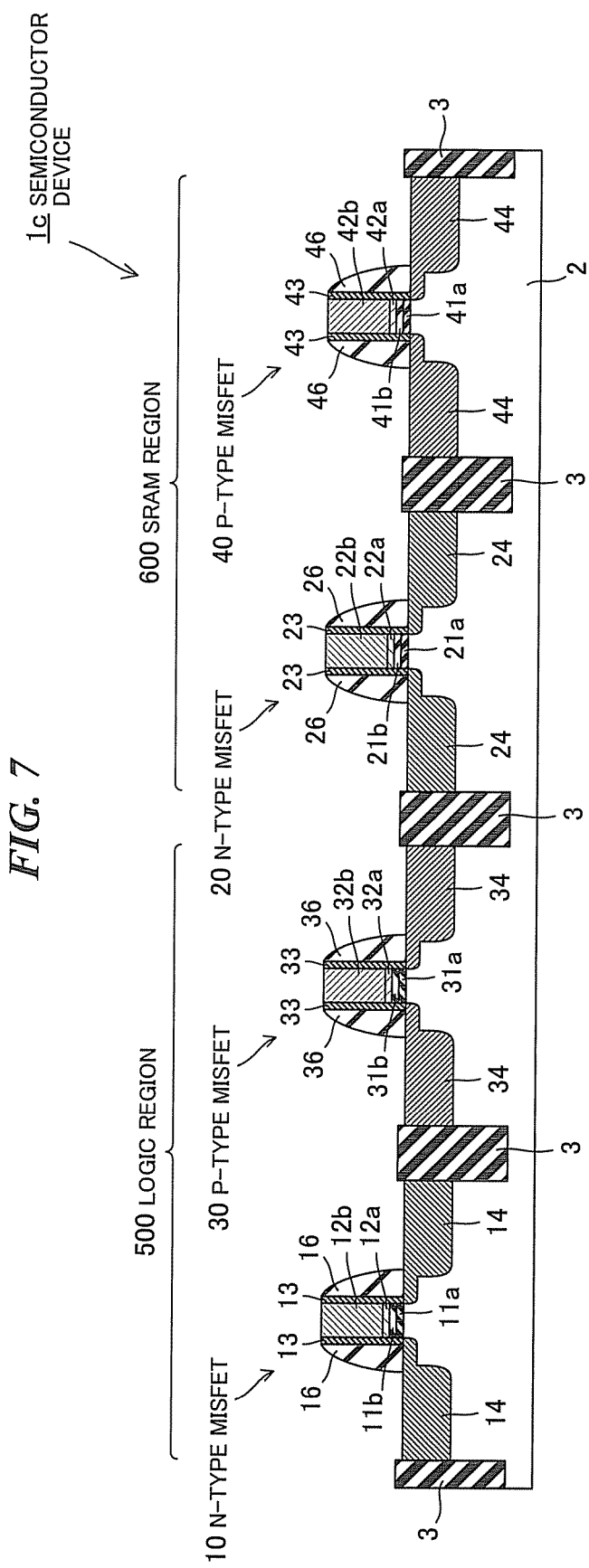
FIG. 7 is a cross sectional view of a semiconductor device according to a third embodiment.

FIG. 7 is a cross sectional view of a semiconductor device 1c according to a third embodiment. The semiconductor device 1c has a Logic region 500 and a SRAM region 600 on a semiconductor substrate 2. The Logic region 500 and the SRAM region 600 are electrically isolated by an element isolation region 3. In addition, an n-type MISFET 10 and a p-type MISFET 30 are formed in the Logic region 500. Meanwhile, an n-type MISFET 20 and a p-type MISFET 40 are formed in the SRAM region 600.

Here, the n-type MISFETs 10 and 20 have the same structure as those of the first embodiment and the threshold voltage of the n-type MISFET 20 is higher than that of the n-type MISFET 10. Meanwhile, the p-type MISFETs 30 and 40 have the same structure as those of the second embodiment and the threshold voltage of the p-type MISFET 40 is higher than that of the p-type MISFET 30.

In addition, the average value of the nitrogen concentration in the interface layer 11a is higher than that in the interface layer 21a, and the average value of the nitrogen concentration in the interface layer 41a is higher than that in the interface layer 31a. Furthermore, the average value of the nitrogen concentration in the interface layer 11a can be substantially equal to that in the interface layer 41a. In this case, since the nitrogen atoms can be simultaneously implanted into the interface layers 11a and 41a, it is possible to simplify the fabrication process. In addition, the average value of the nitrogen concentration in the interface layer 21a can be substantially equal to that in the interface layer 31a. Also in this case, since the nitrogen atoms can be simultaneously implanted into the interface layers 21a and 31a, it is possible to simplify the fabrication process.

Effect of the Third Embodiment

According to the third embodiment, the threshold voltage of the n-type MISFET 20 in the SRAM region 600 can be higher than that of the n-type MISFET 10 in the Logic region 500, and the threshold voltage of the p-type MISFET 40 in the SRAM region 600 can be higher than that of the p-type MISFET 30 in the Logic region 500.

In addition, by controlling each nitrogen concentration in the interface layers 11a, 21a, 31a and 41a, it is possible to set respective appropriate threshold voltages for the n-type MISFET 10 and the p-type MISFET 30 in the Logic region 500 and the n-type MISFET 20 and the p-type MISFET 40 in the SRAM region 600.

In addition, since it is not necessary to adjust the threshold voltage depending on the concentration of the impurity introduced into the semiconductor substrate 2, it is possible to suppress the dispersion in the threshold voltage caused by fluctuation of the impurity in the semiconductor substrate 2.

Other Embodiments

It should be noted that the present invention is not intended to be limited to the above-mentioned first to third embodiments, and the various kinds of changes thereof can be implemented by those skilled in the art without departing from the gist of the invention.

In addition, the constituent elements of the above-mentioned embodiments can be arbitrarily combined with each other without departing from the gist of the invention.

Furthermore, as shown in the above-mentioned first to third embodiments, the concentration of oxygen defect in the high dielectric constant layer formed in the logic region is different from that in the high dielectric constant layer formed in the SRAM region. Therefore, even if these high dielectric constant layers are made of same material, the oxygen concentrations of them are different.

What is claimed is:

1. A semiconductor device, comprising:
a semiconductor substrate having first and second regions;
a first transistor comprising a first gate insulating film and a first gate electrode thereon in the first region on the semiconductor substrate, the first gate insulating film comprising a first interface layer containing nitrogen atoms and a first high dielectric constant layer thereon;
a second transistor comprising a second gate insulating film and a second gate electrode thereon in the second region on the semiconductor substrate, the second gate insulating film comprising a second interface layer and a second high dielectric constant layer thereon, the second interface layer containing nitrogen atoms at an average concentration lower than that of the first interface layer or not containing nitrogen atoms, and the second transistor having a threshold voltage different from that of the first transistor; and
an element isolation region on the semiconductor substrate, the element isolation region containing oxygen atoms and isolating the first transistor from the second transistor,
wherein the first and second transistors are n-type transistors; and the second transistor has a threshold voltage higher than that of the first transistor.

2. The semiconductor device according to claim 1, wherein an average value of concentration of oxygen defect in the second high dielectric constant layer is lower than that in the first high dielectric constant layer.

3. The semiconductor device according to claim 2, wherein the average value of concentration of oxygen defect in the second high dielectric constant layer in a gate length direction end is lower than the average value of concentration of oxygen defect in the second high dielectric constant layer in a middle of the gate length direction.

4. The semiconductor device according to claim 2, wherein a thickness of the first interface layer is substantially same as that of the second interface layer.

5. The semiconductor device according to claim 1, wherein a thickness of the first high dielectric constant layer is substantially same as that of the second high dielectric constant layer.

6. The semiconductor device according to claim 1, wherein a thickness of the first interface layer is substantially same as that of the second interface layer.

7. The semiconductor device according to claim 1, wherein the first high dielectric constant layer and the second high dielectric constant layer are formed by diffusing oxygen atoms contained in the element isolation region into the first and second high dielectric constant layers by heat treatment, thereby making an average value of the concentration of oxygen defect in the second high dielectric constant layer lower than that in the first high dielectric constant layer.

8. A semiconductor device, comprising:
a semiconductor substrate having first and second regions;
a first transistor comprising a first gate insulating film and a first gate electrode thereon in the first region on the semiconductor substrate, the first gate insulating film comprising a first high dielectric constant layer;
a second transistor comprising a second gate insulating film and a second gate electrode thereon in the second region on the semiconductor substrate, the second gate insulating film comprising a second high dielectric constant layer having an average value of concentration of oxygen defect lower than that of the first high dielectric constant layer, and the second transistor having a threshold voltage different from that of the first transistor; and
an element isolation region on the semiconductor substrate, the element isolation region containing oxygen atoms and isolating the first transistor from the second transistor,
wherein the first and second transistors are n-type transistors; and the second transistor has a threshold voltage higher than that of the first transistor.

9. The semiconductor device according to claim 8, wherein the average value of concentration of oxygen defect in the second high dielectric constant layer in a gate length direction end is lower than the average value of concentration of oxygen defect in the second high dielectric constant layer in a middle of the gate length direction.

10. The semiconductor device according to claim 8, further comprising,
a first interface layer formed between the semiconductor substrate and the first high dielectric constant layer, and containing nitrogen atoms; and
a second interface layer formed between the semiconductor substrate and the second high dielectric constant layer, and containing nitrogen atom at an average concentration lower than that of the first interface layer or not containing nitrogen atoms.

11. A semiconductor device, comprising:
a semiconductor substrate having first and second regions;
a first transistor comprising a first gate insulating film and a first gate electrode thereon in the first region on the semiconductor substrate, the first gate insulating film comprising a first interface layer containing nitrogen atoms and a first high dielectric constant layer thereon;
a second transistor comprising a second gate insulating film and a second gate electrode thereon in the second region on the semiconductor substrate, the second gate insulating film comprising a second interface layer and a second high dielectric constant layer thereon, the second interface layer containing nitrogen atoms at an average concentration lower than that of the first interface layer or not containing nitrogen atoms, and the second transistor having a threshold voltage different from that of the first transistor; and
an element isolation region on the semiconductor substrate, the element isolation region containing oxygen atoms and isolating the first transistor from the second transistor,
wherein the first and second transistors are p-type transistors; and the first transistor has a threshold voltage higher than that of the second transistor.

12. The semiconductor device according to claim 11, wherein an average value of concentration of oxygen defect in the second high dielectric constant layer is lower than that in the first high dielectric constant layer.

13. The semiconductor device according to claim 12, wherein the average value of concentration of oxygen defect in the second high dielectric constant layer in a gate length direction end is lower than the average value of concentration of oxygen defect in the second high dielectric constant layer in a middle of the gate length direction.

14. The semiconductor device according to claim 11, wherein a thickness of the first interface layer is substantially same as that of the second interface layer.

15. The semiconductor device according to claim 11, wherein a thickness of the first high dielectric constant layer is substantially same as that of the second high dielectric constant layer.

16. The semiconductor device according to claim 11, wherein the first high dielectric constant layer and the second high dielectric constant layer are formed by diffusing oxygen atoms contained in the element isolation region into the first and second high dielectric constant layers by heat treatment, thereby making an average value of the concentration of oxygen defect in the second high dielectric constant layer lower than that in the first high dielectric constant layer.

17. A semiconductor device, comprising:
a semiconductor substrate having first and second regions;
a first transistor comprising a first gate insulating film and a first gate electrode thereon in the first region on the semiconductor substrate, the first gate insulating film comprising a first high dielectric constant layer;
a second transistor comprising a second gate insulating film and a second gate electrode thereon in the second region on the semiconductor substrate, the second gate insulating film comprising a second high dielectric constant layer having an average value of concentration of oxygen defect higher than that of the first high dielectric constant layer, and the second transistor having a threshold voltage different from that of the first transistor; and
an element isolation region on the semiconductor substrate, the element isolation region containing oxygen atoms and isolating the first transistor from the second transistor,
wherein the first and second transistors are p-type transistors; and the second transistor has a threshold voltage higher than that of the first transistor.

18. The semiconductor device according to claim 17, wherein the average value of concentration of oxygen defect in the first high dielectric constant layer in a gate length direction end is lower than the average value of concentration of oxygen defect in the first high dielectric constant layer in a middle of the gate length direction.

19. The semiconductor device according to claim 17, further comprising,
a first interface layer formed between the semiconductor substrate and the first high dielectric constant layer, and containing nitrogen atoms; and
a second interface layer formed between the semiconductor substrate and the second high dielectric constant layer, and containing nitrogen atom at an average concentration higher than that of the first interface layer or not containing nitrogen atoms.

* * * * *